(12) United States Patent
Powell

(10) Patent No.: US 6,262,791 B1
(45) Date of Patent: Jul. 17, 2001

(54) OPTICAL ELEMENT FOR IMAGING A FLAT MASK ONTO A NONPLANAR SUBSTRATE

(75) Inventor: Karlton Powell, Allen, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/340,955

(22) Filed: Jun. 28, 1999

Related U.S. Application Data

(60) Provisional application No. 60/092,337, filed on Jul. 10, 1998.

(51) Int. Cl.[7] ............................ G03B 27/58; G03B 27/52; G03B 27/32; G06F 17/50; G02B 5/10
(52) U.S. Cl. ................................ 355/47; 355/55; 355/77; 716/19; 359/853
(58) Field of Search .................................. 355/47, 49, 55, 355/77, 53, 43; 430/398; 356/354, 359; 359/641, 859, 731, 853; 257/618; 716/19

(56) References Cited

PUBLICATIONS

U.S. Serial No. 08/858,004, filed on May 16, 1997, Spherical Shaped Semiconductor Integrated Circuit, Akira Ishikawa, Abstract and fifteen (15) sheets of drawings.

U.S. Serial No. 09/094,761, filed on Jun. 15, 1998, Total Internal Reflection Holography Method and Apparatus for Lithography on a 3–D Spherical Shaped Integrated Circuit, Karlton Powell, Abstract and six (6) sheets of drawings.

U.S. Serial No. 09/107,875, filed on Jun. 30, 1998, Spherical Cell Design for VLSI Circuit Design on a Spherical Semiconductor, Eiji Matsunaga and Nobuo Takeda, Abstract and seven (7) sheets of drawings.

*Primary Examiner*—Russell Adams
*Assistant Examiner*—Peter B. Kim
(74) *Attorney, Agent, or Firm*—Haynes and Boone, LLP

(57) ABSTRACT

The present invention provides an apparatus and a method for reshaping the best focus surface to more closely match the surface geometry of a nonplanar surface, such as a sphere. The apparatus includes a complex phase plate located between a mask for generating an image and an elliptical mirror. The mirror has a unique wavefront error and an aspheric image focus surface which is corrected by the complex phase plate, thereby shifting the focus surface to correspond to the nonplanar surface. The apparatus may be used for various shaped substrates, such as a spherical shaped semiconductor device. The complex phase plate includes a variable focal length optical element. The variable focal length optical element may include a diffractive optical element with a plurality of complex phase grating sections repeated over a surface of thereof, located in immediate proximity to the mask.

18 Claims, 2 Drawing Sheets

OPTICAL ELEMENT FOR IMAGING A FLAT MASK ONTO A NONPLANAR SUBSTRATE

CROSS REFERENCE

This application claims benefit of U.S. Ser. No. 60/092,337 filed Jul. 10, 1998.

BACKGROUND OF THE INVENTION

The invention relates generally to photo imaging on nonplanar substrates, and more particularly, to an imaging system using a corrective diffractive optical element with an ellipsoidal mirror for focusing a two dimensional image onto a three dimensional substrate.

Conventional integrated circuits, or "chips," are formed from two dimensional or flat surface semiconductor wafers. The semiconductor wafer is first manufactured in a semiconductor material manufacturing facility and is then provided to a fabrication facility. At the latter facility, several layers are processed onto the semiconductor wafer surface, including various circuit design images, to create a very large scale integrated ("VLSI") design. Although the processed chip includes several layers fabricated thereon, the chip remains relatively flat.

A fabrication facility is relatively expensive due to the enormous effort and expense required to create flat silicon wafers and chips. Moreover, the wafers produced by the above processes typically have many defects which are to the above cutting, grinding and cleaning processes as well as due to the impurities, including oxygen, associated with containers used in forming the crystals. These defects become more and more detrimental as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. Additionally, the positioning and mounting steps are naturally two-dimensional in character, and therefore do not support curved or three-dimensional areas.

U.S. patent Ser. No. 08/858,004 entitled SPHERICAL SURFACE SEMICONDUCTOR INTEGRATED CIRCUIT, herein incorporated by reference as if produced in its entirety, describes a three dimensional, sphere-shaped substrate for receiving various circuits. Of the many process disclosed in the above-referenced application, several are related to imaging a circuit design onto the three dimensional substrate. Often, the circuit design to be imaged may be two dimensional in nature.

One solution for imaging a two-dimensional circuit design to a three-dimensional object, such as a sphere, is to use an elliptical mirror system. However, there are numerous problems associated with the elliptical mirror system for reflecting the image onto the sphere's surface. Referring to FIG. 1, a collimated beam 10 is shown reflecting off of an elliptical mirror 12. The elliptical mirror 12 has two focus points and an image emerging from one focus point is reflected by the elliptical mirror and refocus at the second focus point. As the beam 10 passes through the first focus point of the elliptical mirror 12 at various angles, the beam 10 is reflected toward the second focus point, and towards a spherical semiconductor device 14 located near the second focus point.

In actuality, the beam 12 focuses at a point 16, which is one of an infinite number of points on a best focus surface 18 that emerges between the surface of the elliptical mirror 12 and the device 14. The best focus surface 18 is not spherical. Instead it is aspheric in shape and not compatible with projecting and focusing images on the surface of a spherical semiconductor. As a result, the image on at least some portions of the spherical surface is out of focus.

Therefore, what is needed is an apparatus and a method for reshaping the best focus surface to more closely match the surface geometry of a sphere.

SUMMARY OF THE INVENTION

The present invention, accordingly, provides an apparatus and a method for reshaping the best focus surface of an elliptical mirror to more closely match the surface geometry of a nonplanar substrate. To this end, one embodiment of the apparatus includes a complex phase plate located between a mask for generating the image and the elliptical mirror. The mirror has a unique wavefront error and an aspheric image focus surface which is corrected by the complex phase plate, thereby shifting the focus surface to correspond to the substrate's surface.

The apparatus may be used for various shaped substrates, such as a spherical shaped semiconductor device.

In one embodiment, the complex phase plate includes a variable focal length optical element. The variable focal length optical element may include a diffractive optical element with a plurality of complex phase grating sections repeated over a surface thereof, located in immediate proximity to the mask.

In one embodiment, the method of the present invention corrects the projected image of the mask for the surface of the nonplanar substrate. Wavefront errors are ascertained for the elliptical mirror by projecting an image of the mask onto the substrate. Phase differentials for correcting the wavefront errors for each section of the mask are determined and an optical element generated to introduce the phase differentials, thereby correcting the projected image to a modified best focus surface.

An advantage of the present invention is that a two-dimensional mask design can be projected and focused on to a spherical surface using an elliptical mirror by altering the best focus surface of the elliptical mirror.

DESCRIPTION OF THE EMBODIMENTS

Figure 1:
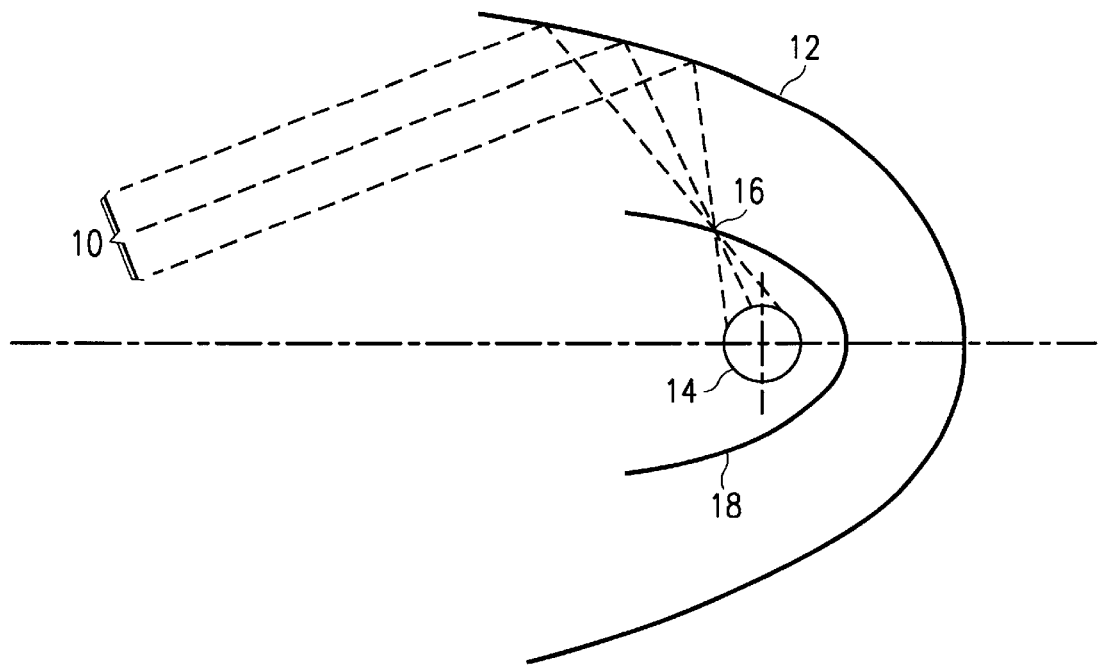
FIG. 1 illustrates a portion of a prior art system that uses a reflective elliptical mirror to reflect a collimated beam onto the surface of a spherical semiconductor device.

As discussed above, FIG. 1 illustrates a prior art system that uses a reflective elliptical mirror to reflect a collimated beam onto the surface of a spherical semiconductor device.

Before continuing with the present disclosure, two terms may be defined for better clarification. A "best focus surface" is the focus surface of a mirror for a continuum of collimated beams passing at various angles through a first focal point of the mirror. For an elliptical mirror, the best focus surface is normally an aspheric surface in close proximity to a second focal point of the elliptical mirror. A "sphere" is the set of all points in space with a constant distance (a radius) from a specific point (a center). A sphere is a surface and not a solid body, although it may enclose a solid body.

Figure 2:
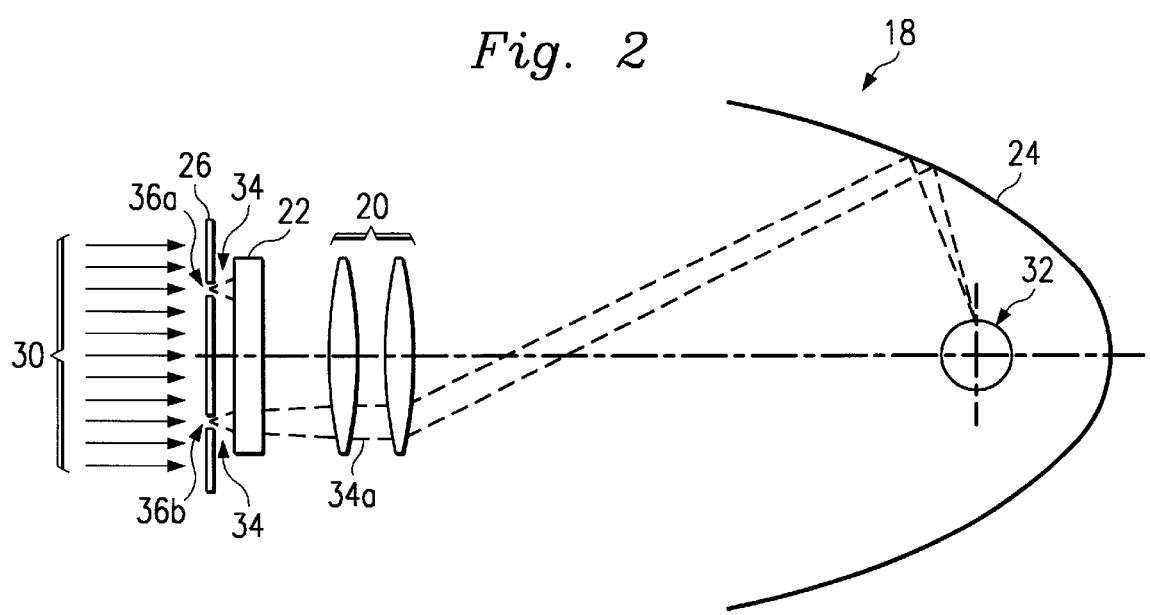
FIG. 2 illustrates a system using an optic element to focus an image from a mask onto the surface a spherical semiconductor device with the optical element located in immediate proximity to the mask.

Referring now to FIG. 2, in one embodiment, a system 18 is shown having a lens system 20, an optical element 22, and an elliptical mirror 24. The optical element 22 exhibits a variety of properties, including various focal properties, diffraction properties, and/or aspheric surface features. The optical element 22 introduces a wavelength differential to a beam emerging therefrom depending on the wavefront error being corrected, as discussed below. Examples of a specific property of an optical element include a variable-focal-element 22 introduces a wavelength differential to a beam emerging therefrom depending on the wavefront error being corrected, as discussed below. Examples of a specific property of an optical element include a variable-focal-length optic element (VFLOE), a diffractive optic element, or a variable-focal-length Fresnel lens.

The system 18 focuses an image, generated from a mask 26 that is illuminated by rays 30, onto the surface of a spherical semiconductor substrate or device 32. The mask 26 is typically a flat metal mask containing a circuit design that is to be imaged onto the surface of the device 32. The image generated by the illuminated mask 26 produces rays 34 that are diffracted as they pass through transparent portions 36a and 36b of the mask 26. The lenses 20 collimate the rays 34, which are reflected by the elliptical mirror 24 to converge and, hence, focus onto the best focus surface for imaging the device 32.

The rays 34 pass through the optical element 22 located immediately adjacent the mask 26 before the rays 34 are greatly diffracted. As the rays 34 pass through the optical element 22, the rays are "steered" to produce steered rays 34a that will eventually focus on the surface of the device 32. The steering is achieved by the optical element 22, which introduces a wavelength or phase differential to the rays 34. Introducing the phase differential has the effect of shifting the best focus surface onto the device 32. This alters the conic constant of the elliptical mirror 24 to approximate the conic constant of the spherical shaped device 32. The effect of altering the conic constant of the elliptical mirror results in that the best focus surface "shifts" to correspond to the surface of the device 32.

Figure 3:
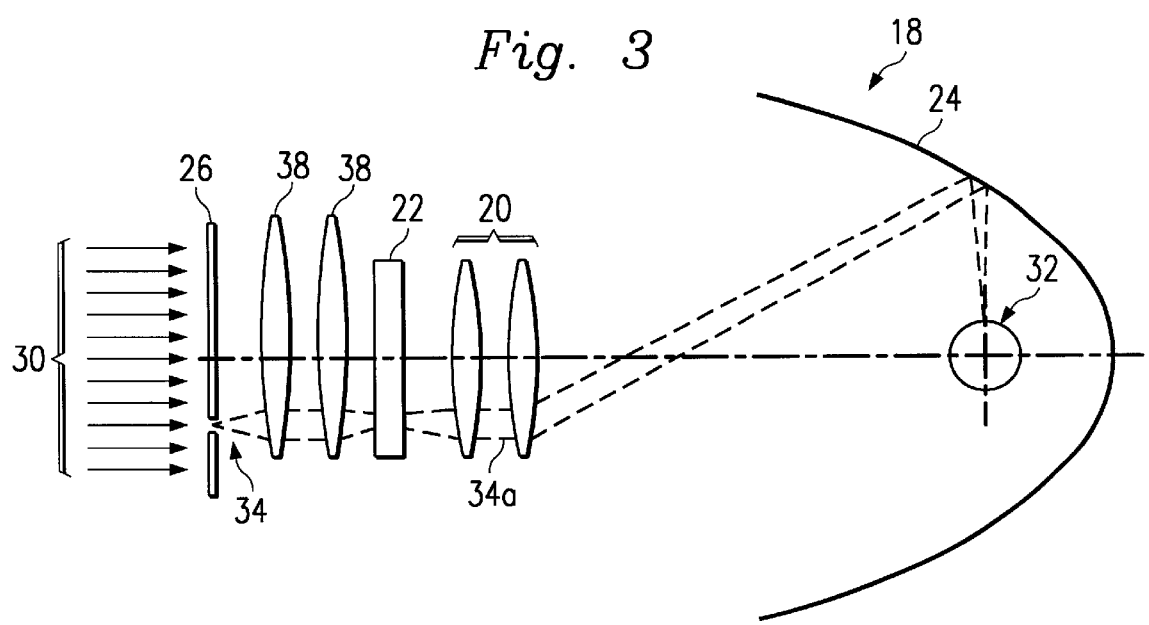
FIG. 3 illustrates the system of FIG. 2 with imaging optics located between the optical element and the mask.

Referring now to FIG. 3, in another embodiment, as the spacial separation between the optical element 22 and the mask 26 increases, the amount of diffraction of the rays 34 also increases. Accordingly, imaging from the lenses 38 on a portion of the optical element 22 that has been designed to correct or beam steer the rays 34 passing through a corresponding portion of the mask 26 to produce the steered beam 34a.

Figure 4:
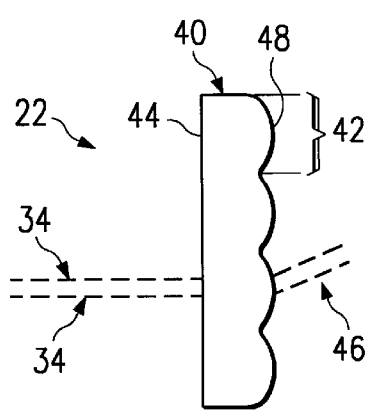
FIG. 4 is a side view a specific example of the optical element, namely a diffractive optic element (DOE).

Referring now to FIG. 4, one embodiment of a VFLOE, for the optical element 22, is shown in the form of a diffractive optic element (DOE) 40. The DOE 40 has a complex phase grating section 42 that is repeated over the surface of the DOE corresponding to various segments of the mask 26 (FIG. 2). Each section 42 introduces a continuously varying phase differential to rays 34, entering the DOE 40 through an incident side 44, that emerge as phase adjusted rays 34a. Consequently, each of the sections 42 of the DOE 40 will have a curved emerging surface 48 corresponding to the amount of beam-steering necessary to focus the image onto the device 32 (FIG. 2). As indicated above, the rays 34 passing through each section of the mask 26 are focused onto a specific portion of the DOE 40. Therefore, each section of the DOE 40 focuses a specific section of the mask 26 depending on the wavefront error.

Figure 5:
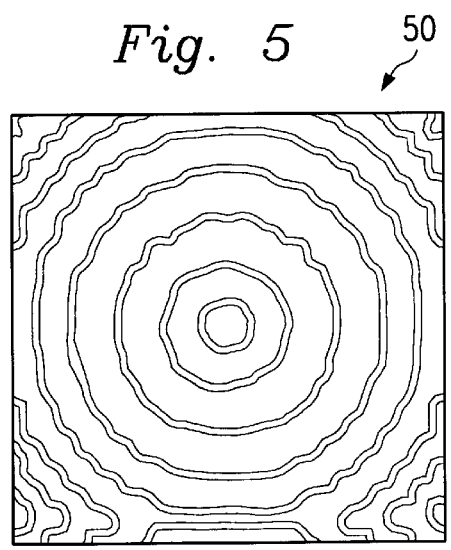
FIG. 5 is a graphical representation of wavefront errors.

Referring also to FIG. 5, wavefront errors 50 are shown in graphical representation for a particular segment of the DOE 40 as the rays 34 emerging from the mask 26 transition from zero to 360 degrees of phase and then back through zero without an optical element in the ray path to correct the errors. The wavefront errors 50 are used to generate data relating to the path difference of the light and thus establish the necessary phase differential needed to "beam steer" the rays 34 to focus onto the surface of the sphere 32. More specifically, this has the effect of varying a focal length of the elliptical mirror 24 with changes in angle measured relative to the z-axis, which is normal to the plane of the DOE 40, through the first focus of the elliptical mirror 24. The relative effect is achieved by varying the radial dimension of each segment 42 of the DOE 40 in correspondence to a unique segment of the mask 26. Accordingly, the DOE 40 will be in the form of a surface relief function concentric to the z-axis of the system 18. The surface relief function mathematically defines the emerging surface 48 of the DOE 40. The surface relief function has some degree of radial symmetry about the z-axis. For example, specific periodic angular shifts about the z-axis produce a circularly symmetrical surface relief function. Additionally, the DOE 40 will correct for variations of the mask 26 due to angular rotations about the z-axis, defined as the θ dimension.

It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A system for projecting an image of a mask onto a surface of a nonplanar semiconductor substrate to implement a design thereon, the system comprising:

an elliptical mirror normally having a best focus surface surrounding a portion of the substrate but not shaped according to the substrate;

means for projecting light to illuminate the mask to produce the image; and means for altering the phase of the image to control diffraction, thereby shifting the best focus surface into a shape according to the substrate.

2. The system of claim 1 wherein the shape of the nonplanar semiconductor substrate is spherical.

3. The system of claim 1 wherein the means for altering the phase includes a variable focal length optical element.

4. The system of claim 3 wherein the variable focal length optical element includes a plurality of diffractive optical elements according to portions of the mask.

5. The system of claim 1 wherein the means for altering the image is in immediate proximity to the mask.

6. The system of claim 1 wherein the means for altering the image is separated from the mask by at least one lens.

7. A system for projecting an image onto a nonplanar device, the system comprising:

a mask for generating the image;

an elliptical mirror positioned opposite the mask for projecting the image onto the device, wherein the mirror has a unique wavefront error and a normally aspheric surface of best focus; and a complex phase plate located between the mask and the elliptical mirror for correcting the wavefront error of the mirror;

whereby, when light is projected through the mask and reflected off the elliptical mirror towards the nonplanar device, the surface of best focus of the elliptical mirror is shifted to correspond to the surface of the device.

8. The system of claim 7 wherein the device is spherical.

9. The system of claim 7 wherein the means for correcting the wavefront error includes a variable focal length optical element.

10. The system of claim 9 wherein the variable focal length optical element includes a diffractive optical element with a plurality of complex phase grating sections repeated over a surface of thereof.

11. The system of claim 7 wherein the means for correcting the wavefront error is in immediate proximity to the mask.

12. The system of claim 7 wherein the means for correcting the wavefront errors is separated from the mask by a plurality of lenses.

13. A method for designing a device to correct the projected image of a mask on the surface of a nonplanar substrate using an elliptical mirror having a best focus surface, the method comprising the steps of:

establishing wavefront errors for the elliptical mirror by projecting an image of the mask onto the substrate;

determining phase differentials required to correct the wavefront errors for each section of the mask; and generating an optical element to introduce the phase differentials, thereby correcting the projected image to a modified best focus surface.

14. The method of claim 13 wherein the substrate is a semiconductor.

15. The method of claim 14 wherein the substrate is spherical.

16. A method for projecting an image of a mask onto a surface of a nonplanar substrate substrate using an elliptical mirror having a best focus surface, the method comprising the steps of:

establishing wavefront errors for the elliptical mirror by projecting an image of the mask onto the substrate;

determining phase differentials required to correct the wavefront errors for each section of the mask; and generating an optical element to introduce the phase differentials.

17. The method of claim 16 wherein the substrate is a semiconductor.

18. The method of claim 17 wherein the substrate is spherical.

* * * * *